United States Patent
Mazhari et al.

(10) Patent No.: US 9,515,273 B2
(45) Date of Patent: Dec. 6, 2016

(54) THIN FILM TRANSISTOR WITH A CURRENT-INDUCED CHANNEL

(71) Applicant: Indian Institute of Technology Kanpur, Kanpur, Uttar Pradesh (IN)

(72) Inventors: Baquer Mazhari, Uttar Pradesh (IN); Ankita Gangwar, Uttar Pradesh (IN)

(73) Assignee: INDIAN INSTITUTE OF TECHNOLOGY KANPUR (IN)

( * ) Notice: Subject to any disclaimer, the term of this patent is extended or adjusted under 35 U.S.C. 154(b) by 0 days.

(21) Appl. No.: 14/380,726

(22) PCT Filed: Jun. 20, 2013

(86) PCT No.: PCT/IB2013/055078
§ 371 (c)(1),
(2) Date: Aug. 25, 2014

(87) PCT Pub. No.: WO2014/102625
PCT Pub. Date: Jul. 3, 2014

(65) Prior Publication Data
US 2015/0008420 A1   Jan. 8, 2015

(30) Foreign Application Priority Data
Dec. 24, 2012 (IN) .......................... 3997/DEL/2012

(51) Int. Cl.
*H01L 51/00* (2006.01)
*H01L 51/05* (2006.01)

(52) U.S. Cl.
CPC ....... *H01L 51/0562* (2013.01); *H01L 51/0046* (2013.01); *H01L 51/0054* (2013.01);
(Continued)

(58) Field of Classification Search
CPC ............. H01L 51/0562; H01L 51/0545; H01L 51/0045; H01L 51/0081; H01L 51/0068; H01L 51/0072; H01L 51/0073; H01L 51/0055; H01L 51/0054; H01L 51/0058; H01L 51/0091
See application file for complete search history.

(56) References Cited

U.S. PATENT DOCUMENTS 6,617,609 B2    9/2003  Kelley et al.
6,836,067 B1 *  12/2004 Imai ............................. 313/504
(Continued)

FOREIGN PATENT DOCUMENTS

EP    2194582 A1    6/2010
TW    201008978 A   3/2010

OTHER PUBLICATIONS

Se Hyun Kim et al., "Hysteresis Behaviour of Low-Voltage Organic Field-Effect Transistors Employing High Dielectric Constant Polymer Gate Dielectrics", Journal of Physics D: Applied Physics, 2010, vol. 43, No. 465102, IOP Publishing.
(Continued)

*Primary Examiner* — Dale E Page
*Assistant Examiner* — Quovaunda V Jefferson
(74) *Attorney, Agent, or Firm* — Ren-Sheng International

(57) ABSTRACT

A thin film transistor (TFT) includes a hole transport layer having a first side and a second side and an electron transport layer having a first side and a second side. The first side of the electron transport layer is directly interfaced to the second side of the hole transport layer. The electron transport layer includes a material having greater ionization potential and greater electron affinity than the hole transport layer, thereby forming a hole barrier and an electron barrier at the junction between the electron transport layer and the hole transport layer. A channel in the TFT is created by current injected into the electron transport layer from a gate electrode rather than by an electrostatic field generated by voltage applied to the gate electrode. The accumulated
(Continued)

charge density in the channel of the TFT can be significantly larger than what can be generated through field effect principle, therefore a much lower gate voltage is needed than in a conventional TFT.

20 Claims, 4 Drawing Sheets

(52) U.S. Cl.
CPC ...... *H01L 51/0055* (2013.01); *H01L 51/0058* (2013.01); *H01L 51/0068* (2013.01); *H01L 51/0072* (2013.01); *H01L 51/0073* (2013.01); *H01L 51/0081* (2013.01); *H01L 51/0091* (2013.01); *H01L 51/0545* (2013.01)

(56) References Cited

U.S. PATENT DOCUMENTS

| | | | |
|---|---|---|---|
| 2005/0148127 A1 | 7/2005 | Jung et al. | |
| 2006/0214160 A1* | 9/2006 | Furukawa | B82Y 10/00 257/40 |
| 2008/0224127 A1* | 9/2008 | Marks | H01L 51/0533 257/40 |
| 2012/0175602 A1* | 7/2012 | Hwang et al. | 257/40 |

OTHER PUBLICATIONS

Yingxi Lu et al., "Low-Voltage Organic Transistors with Titanium Oxide/polystyrene Bilayer Dielectrics", Applied Physics Letters, 2009, pp. 113303-1-113303-3, vol. 94, American Institute of Physics.
Hideyuki Kawaguchi et al., "Control of Threshold Voltage and Hysteresis in Organic Field-Effect Transistors", Applied Physics Letters, 2009, pp. 093305-1-093305-3, vol. 94, American Institute of Physics.
Paul H. Wobkenberg et al., "Low-Voltage Organic Transistors Based on Solution Processed Semiconductors and Self-Assembled Monolayer Gate Dielectrics", Applied Physics Letters, 2008, pp. 013303-1-013303-3, vol. 93, American Institute of Physics.
Mark E. Roberts et al., "Cross-Linked Polymer Gate Dielectric Films for Low-Voltage Organic Transistors", Chem. Mater., 2009, pp. 2292-2299, vol. 21, No. 11, American Chemical Society.
Se Hyun Kim et al., "Low-Operating-Voltage Pentacene Field-Effect Transistor with a High-Dielectric-Constant Polymeric Gate Dielectric", Applied Physics Letters, 2006, pp. 183516-1-183516-3, vol. 89, American Institute of Physics.
Raffaella Capelli et al., "Organic Light-Emitting Transistors with an Efficiency That Outperforms the Equivalent Light-Emitting Diodes", Nature Materials, May 2, 2010, pp. 496-503, vol. 9, Macmillan Publishers Limited.
Hagen Klauk et al., "Pentacene Organic Transistors and Ring Oscillators on Glass and on Flexible Polymeric Substrates", Applied Physics Letters, Jun. 9, 2003, pp. 4175-4177, vol. 82, No. 23.
Josephine B. Lee et al., "Organic Transistors on Fiber: A First Step Towards Electronic Textiles", IEEE, 2003.
Yong-Hoon Kim et al., "Organic TFT Array on a Paper Substrate", IEEE Electron Device Letters, Oct. 2004, pp. 702-704, vol. 25, No. 10.
P.F. Baude et al., "Pentacene-Based Radio-Frequency Identification Circuitry", Applied Physics Letters, Jun. 2, 2003, pp. 3964-3966, vol. 82, No. 22, American Institute of Physics.
J. Puigdollers et al., "Pentacene Thin-Film Transistors with Polymeric Gate Dielectric", Organic Electronics, 2004, pp. 67-71, vol. 5, Elsevier.
Lei Zhu, "Modeling of a-Si: H TFT I-V Characteristics in the Forward Subthreshold Operation", Presented to the University of Waterloo, 2005, pp. 1-72.
International Search Report and the Written Opinion of the International Searching Authority, International application No. PCT/IB2013/055078, Oct. 24, 2013.
Jerome Tilman, "Fabrication and Characterization of Thin-Film Transistors with Organic Heterostructure of Pentacene and PTCDIC13", MS Thesis, Universitat of Polytecnica de Catalunya, Jun. 28, 2010. [retrieved on Oct. 22, 2013]. Retrieved from the Internet at < URL:http://upcommons.upc.edu/pfc/bitstream/2099.1/9808/1/FINAL%20THESIS%20Jerome%20Tilman-1.pdf>.
Marco Stella, "Study of Organic Semiconductors for Device Applications", PhD Thesis, Universitat De Barcelona, Dec. 2009, [retrieved on Oct. 22, 2013]. Retrieved from the Internet at <URL: www.ub.edu/ges/tesimstella.pdf>.
Kang et. al., "Ambipolar organic thin-film transistors using C60/pentacene structure: Characterization of electronic structure and device property", Applied Physics Letters, 2005, pp. 233502-1 to 233502-3, vol. 87, American Institute of Physics.
Constance Rost et al., "Light-emitting Ambipolar Organic Heterostructure Field-effect Transistor", Synthetic Metals, 2004, pp. 237-241, vol. 146, Elsevier B.V.
Ralph G. Pearson, "Absolute Electronegativity and Hardness Correlated with Molecular Orbital Theory", Proceedings of the National Academy of Sciences USA, Nov. 1986, pp. 8440-8441, vol. 83.
Chih-Wei Chu et al., "Tuning Acceptor Energy Level for Efficient Charge Collection in Copper-phthalocyanine-based Organic Solar Cells", Applied Physics Letters, 2006, pp. 153504-1-153504-3, vol. 88, American Institute of Physics.
Hoon-Seok Seo et al., "Fabrication and Characterization of Air-stable, Ambipolar Heterojunction-based Organic Light-emitting Field-effect Transistors", Organic Electronics, ScienceDirect, 2009, pp. 1293-1299, vol. 10, Elsevier B.V.
Prashant Sonar et al., "High-Mobility Organic Thin Film Transistors Based on Benzothiadiazole-Sandwiched Dihexylquaterthiophenes", Chem. Mater., 2008, pp. 3184-3190, vol. 20, No. 9, American Chemical Society.
Eva J. Feldmeier et al., "A Color-Tuneable Organic Light-Emitting Transistor", Advanced Materials, 2010, pp. 3568-3572, vol. 22, Wiley-VCH Verlag GmbH & Co. KGaA, Weinheim.
Chih-Wei Chu et al., "Efficient Photovoltaic Energy Conversion in Tetracene-C60 Based Heterojunctions", Applied Physics Letters, 2005, pp. 243506-1-243506-3, vol. 86, American Institute of Physics.
Liuxiang et al., "Study on Photoelectric Propertie of CuPc-C60 Heterojunction Device", Projects of Liaoning Province Planning, IEEE, 2011, pp. 1831-1834.

* cited by examiner

THIN FILM TRANSISTOR WITH A CURRENT-INDUCED CHANNEL

CROSS-REFERENCE TO RELATED APPLICATIONS

The present application is a U.S. national stage filing under 35 U.S.C. §371 application of International Application No. PCT/IB2013/055078, filed on Jun. 20, 2013 and entitled "THIN FILM TRANSISTOR WITH A CURRENT-INDUCED CHANNEL." The International Application claims priority under 35 U.S.C. §119(a) to Indian Patent Application No. 3997/DEL/2012, filed on Dec. 24, 2012. The Indian Patent Application and the International Application, including any appendices or attachments thereof, are incorporated by reference herein in their entirety.

BACKGROUND

Unless otherwise indicated herein, the approaches described in this section are not prior art to the claims in this application and are not admitted to be prior art by inclusion in this section.

A thin film transistor, or TFT, is a specialized field-effect transistor fabricated by depositing and patterning a series of thin films on a supporting substrate, such as glass. The various thin films are used to form the semiconductor active layer, the dielectric layer, and metallic contacts. Unlike conventional transistors, which typically use a semiconductor substrate, TFTs can be formed on a passive substrate, such as glass or plastic, which facilitates the fabrication of TFTs on large substrates. A common TFT substrate is glass, which is used for liquid crystal display applications, but TFTs are being actively developed for a variety of other applications as well, including low-cost sensors, logic circuits, and radio-frequency identification tags.

SUMMARY

In accordance with at least some embodiments of the present disclosure, a semiconductor device comprises a hole transport layer having a first side and a second side, an electron transport layer having a first side and a second side, a first electrode directly interfaced to the first side of the hole transport layer, a second electrode directly interfaced to the first side of the hole transport layer and physically separated from the first electrode, and a gate electrode directly interfaced to the second side of the electron transport layer. The first side of the electron transport layer is directly interfaced to the second side of the hole transport layer. The hole transport layer comprises a material in which hole mobility is greater than the electron mobility and having a first ionization potential and a first electron affinity. The electron transport layer comprises a material in which electron mobility is greater than hole mobility and having a second ionization potential and a second electron affinity, the second ionization potential being greater than the first ionization potential and the second electron affinity being greater than the first electron affinity.

In accordance with at least some embodiments of the present disclosure, a thin film transistor structure comprises a hole transport layer having a first side and a second side, an electron transport layer having a first side and a second side, a first electrode directly interfaced to the first side of the hole transport layer, a second electrode directly interfaced to the first side of the hole transport layer and physically separated from the first electrode, and a third electrode directly interfaced to the second side of the electron transport layer. The first side of the electron transport layer is directly interfaced to the second side of the hole transport layer. The hole transport layer comprises a material in which hole mobility is greater than the electron mobility and having a first ionization potential and a first electron affinity. The electron transport layer comprises a material in which electron mobility is greater than hole mobility and having a second ionization potential and a second electron affinity, the second ionization potential being greater than the first ionization potential and the second electron affinity being greater than the first electron affinity.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
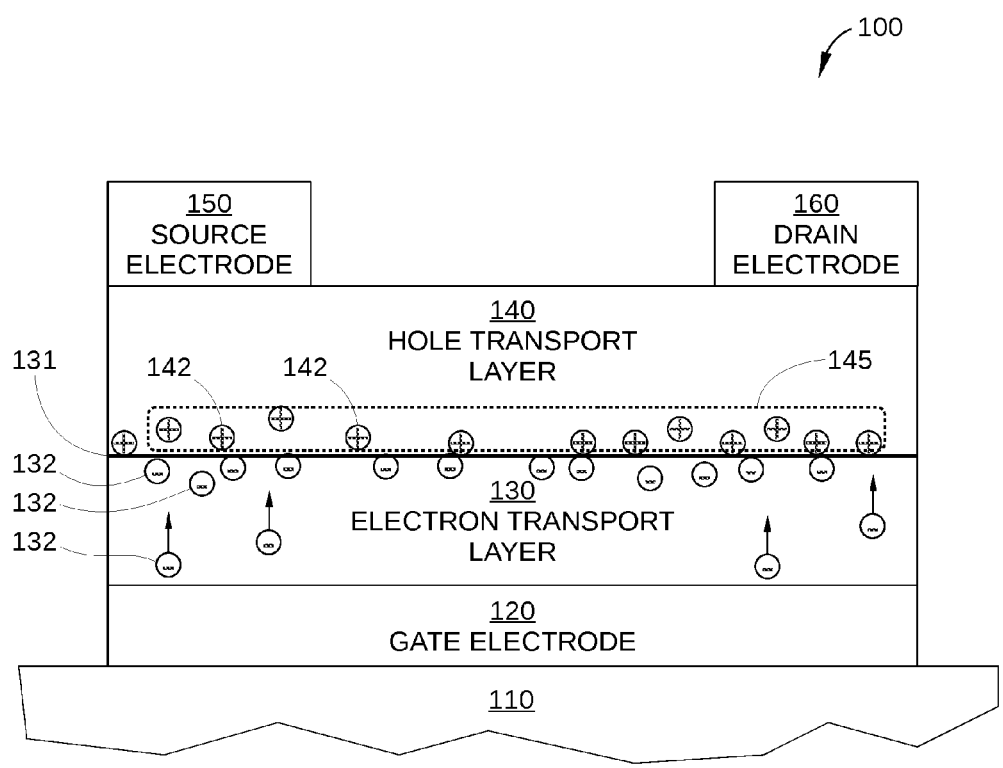
FIG. 1 illustrates a simplified schematic cross-sectional view of a current-induced channel thin-film transistor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the disclosure, as generally described herein, and illustrated in the Figures, can be arranged, substituted, combined, and designed in a wide variety of different configurations, all of which are explicitly contemplated and make part of this disclosure.

Thin-film transistors (TFTs) have a wide variety of applications, from liquid crystal displays to low-cost devices formed on flexible substrates like plastic, fabric, and even paper. Although performance of TFTs has improved significantly, there are a number of challenging problems that still need to be addressed, particularly the relatively high voltage required for operation of TFTs. A common approach is to reduce the thickness of dielectric film used to isolate the active semiconducting material in a TFT from the gate electrode, but reliable deposition of the uniform films required for such transistors is problematic. Furthermore, scaling down the thickness of the TFT dielectric film, even when uniformly deposited, leads to a large increase in gate leakage current, which is highly undesirable. Another approach for reducing the operating voltage of a TFT is to use an insulator film with high dielectric constant, but currently known materials with sufficiently high dielectric constant are difficult to deposit and generally form a poor interface with TFT semiconducting material.

Embodiments disclosed herein include a TFT in which the channel in the TFT is created by current injected from the gate electrode rather than by an electrostatic field generated by voltage applied to the gate electrode. Such a TFT is referred to herein as a "current-induced channel transistor". In a current-induced channel TFT, the accumulated charge density in the channel can be made significantly higher than what can be generated through field effect. Consequently, to produce a desired accumulated charge density for forming a transistor channel, a much lower gate voltage can be used in a current-induced channel transistor as described herein than in a conventional TFT. This improvement in accumulated charge density may be achieved through a proper choice of materials for the current-induced channel transistor, as described below.

FIG. 1 illustrates a simplified schematic cross-sectional view of a current-induced channel transistor TFT 100, arranged in accordance with at least some embodiments of the present disclosure. TFT 100 is a thin-film transistor formed on substrate 110, and includes a gate electrode 120, an electron transport layer 130, a hole transport layer 140, a source electrode 150, and a drain electrode 160, arranged as shown. Specifically, hole transport layer 140 has a first side and a second side, and electron transport layer 130 also has a first side and a second side. Source electrode 150 and drain electrode 160 are directly interfaced to the first side of hole transport layer 140. The second side of hole transport layer 140 is directly interfaced to the first side of electron transport layer 130. The second side of electron transport layer 130 is directly interfaced to gate electrode 120.

Gate electrode 120, electron transport layer 130, hole transport layer 140, source electrode 150, and drain electrode 160 may be formed by the sequential deposition and patterning of various thin films. By way of example, in the embodiment illustrated in FIG. 1, TFT 100 is depicted having a bottom gate configuration with top drain and source electrodes. However, any other configurations of TFTs that include an electron transport layer and a hole transport layer also fall within the scope of the disclosure.

Substrate 110 may comprise any technically feasible TFT substrate known in the art, including glass, plastic, flexible fabric, paper, and the like. In some embodiments, substrate 110 may be a material transparent to visible light, such as glass and some plastics, to facilitate the use of TFT 100 for liquid crystal displays.

Gate electrode 120 can be formed from a conductive layer deposited on substrate 110, such as a patterned molybdenum or indium-tin oxide layer. In operation, voltage applied to gate electrode 120 causes the formation of a channel 145 between source electrode 150 and drain electrode 160, and therefore controls the amount of charge carriers flowing there between.

Electron transport layer 130 is roughly analogous to the gate oxide/insulator layer of a conventional TFT, and is generally formed from a thin film of a material in which electron mobility is significantly higher than the hole mobility. Furthermore, said material is selected to form an electron energy barrier and a hole energy barrier at the junction 131 of electron transport layer 130 and hole transport layer 140. Specifically, an electron barrier is formed at junction 131 when electron transport layer 130 has higher electron affinity than hole transport layer 140, and a hole barrier is formed at junction 131 when electron transport layer 130 has higher ionization potential than hole transport layer 140. Thus, the specific material selected for electron transport layer 130 depends in part on what material is used for hole transport layer 140. Ionization potential (IP) of a material is measurable using ultraviolet photo-emission spectroscopy (UPS) or Resonance Ionization Mass Spectrometry (RIMS) or Photoelectron Spectroscopy, and electron affinity (EA) of a material can be estimated as the difference of IP and energy gap $E_g$. Energy gap $E_g$ is measurable using UV-visible spectroscopy and/or optical transmission spectra.

Suitable materials that may be used to form electron transport layer 130 include Buckminsterfullerene (C60), with IP=6.0 eV and EA=4.5 eV; tris(8-hydroxyquinolinato) aluminum (Alq)3, with IP=5.7 eV and EA=3.0 eV; α,ω-disubstituted-quaterthiophenes with perfluorohexyl chains (DFH-4T), with IP=6.2 eV and EA=3.3 eV; N,N'-dioctyl-3, 4,9,10-perylenedicarboximide (PTCDI-C8), with IP=6.3 eV and EA=3.9 eV; 3,4,9,10 perylenetetracarboxylic bisbenz-imidazole (PTCBI), with IP=6.1 eV and EA=4.6 eV; and naphthalene-tetracarboxylic-dianhydride (NTCDA), with IP=8.0 eV and EA=4.0 eV; among others. For example, suitable inorganic materials may also be used to form electron transport layer 130 and still fall within the scope of the disclosure. In some embodiments, electron transport layer 130 may include a material having a relatively high dielectric constant, for example at least about 3.0. In such embodiments, the high dielectric constant of electron transport layer 130 enhances channel charge in the same way that channel charge is improved in a conventional TFT when dielectric constant of the gate oxide layer is increased. In addition, in some embodiments, electron transport layer 130 may include a material having relatively low electron mobility, which, as described below, reduces gate current during operation of TFT 100. It is noted that electron mobility in organic materials suitable for use in electron transport layer 130 can be varied by orders of magnitude depending on deposition conditions.

Hole transport is generally formed from a thin film of material deposited on electron transport layer 130. Hole transport layer 140 can be considered roughly analogous to the active semiconductor layer of a conventional TFT, and as such, includes the portion of TFT 100 in which channel 145 is formed during operation. In some embodiments, hole transport layer 140 includes an organic semiconductor, such as pentacene ($C_{22}H_{14}$), which has an EA of 2.7-2.9 eV and an IP of 4.8-5.0 eV. Other suitable materials for hole transport layer 140 include tetracene, with EA=2.4 eV and IP=5.4 eV; ditetracene, with EA=2.9 eV and IP=5.0; copper phthalocyanine (CuPc), with EA=3.5 eV and IP=5.2 eV; 5,5'-Bis(3-hexyl-2-thienyl)-2,2'-bithiophene α,ω-Dihexylquaterthiophene (DH-4T) with EA=2.89 eV and IP=5.8; α,ω-Dihexylsexithiophene (DH-6T), with IP=5.2 eV and EA=2.9 eV; dihexyl-benzothiadiazole-quarter thiophene (DH-BTZ-4T), with IP=5.15 eV and EA=3.26 eV. It is noted that the dielectric constant for organic materials suitable for use as hole transport layer 140, such as the materials listed above, generally have a dielectric constant in the range of 3.0 to 4.0.

As noted above, in order to form suitable hole and electron barriers at junction 131, materials making up hole transport layer 140 and electron transport layers 130 are selected in combination, so that the values of IP and the EA of the material used for hole transport layer 140 is significantly lower than the values of IP and EA, respectively, in electron transport layer 130. Since the EA and IP of pentacene are, respectively, 2.7-2.9 eV and 4.8-5.0 eV, suitable hole transport layer 140/electron transport layer 130 combinations include pentacene/C-60, pentacene/PTCDI-C8, pentacene/DFH-4T, and pentacene/PTCBI. Other suitable hole transport layer 140/electron transport layer 130 combinations include, tetracene/C-60, tetracene/PTCDI-C, tetracene/DFH-4T, tetracene/PTCBI, CuPc/PTCDI-C8, CuPc/C-60, and CuPc/PTCBI. Any other combination of electron transport material 130 and hole transport material 140 for which a barrier is formed for electrons moving from electron transport material 130 to hole transport material 140 and holes moving from hole transport material 140 to electron transport material 130 also fall within the scope of the disclosure.

Source electrode 150 and drain electrode 160 can be formed from a conductive layer deposited on hole transport layer 140, such as a patterned molybdenum or indium-tin oxide layer. Alternatively, source electrode 150 and drain electrode 160 can be formed by depositing metals, such as gold (Au), which can inject carriers through a shadow mask. In some embodiments, source electrode 150 and drain electrode 160 may be formed concurrently with each other, i.e., patterned from the same layer of conductive material.

In operation, TFT 100 is considered "on" when a suitable voltage is applied to gate electrode 120. In embodiments in which TFT 100 is configured as a p-type transistor, a negative voltage is applied to gate electrode 120. Conversely, in embodiments in which TFT 100 is configured as an n-type transistor, a positive voltage is applied to gate electrode 120. By way of example, the operation of TFT 100 is herein described in terms of a p-type transistor, but instances in which TFT 100 is configured as an n-type transistor also fall within the scope of the disclosure.

When a suitable voltage is applied to gate electrode 120, channel 145 is created in hole transport layer 140 not by an electrostatic field from gate electrode 120, but instead by a current injected from gate electrode 120. This is achieved by replacing the gate oxide layer of a conventional TFT with a layer of material that predominantly transports electrons, i.e., electron transport layer 130. Because electron transport layer 130 is not an insulator, electrons flow into electron transport layer 130 when voltage is applied to gate electrode 120. Furthermore, because electron transport layer 130 and hole transport layer 140 are selected so that there is a barrier formed at junction 131 for the flow of electrons from electron transport layer 130 to hole transport layer 140, electrons 132 injected from gate electrode 120 into electron transport layer 130 accumulate proximate junction 131. This accumulation of electrons 132 proximate junction 131 causes holes 142 to accumulate in hole transport layer 140 proximate junction 131, thereby forming channel 145, as shown. The accumulation of electrons 132 proximate junction 131 continues until a steady state is reached where the electrons 132 crossing the barrier and recombining with holes 142 in the channel 145 equals the electrons injected from the gate electrode 120. At this point, the current due to electrons 132 crossing junction 131 and recombining with holes 142 in the channel 145 equals the current of electrons 132 injected from gate electrode 120.

Through the appropriate selection of materials for electron transport layer 130 and hole transport layer 140, junction 131 acts as an electron barrier and a hole barrier that allow a very small current flow from gate electrode 120 to form a desired channel 145. Specifically, the hole barrier at junction 131 can be selected to serve as a suitable blocker of holes 142 flowing from channel 145 to the electron transport layer 130, and the electron barrier at junction 131 can be selected to serve as a suitable blocker of electrons 132 flowing from channel 145 to the electron transport layer 130. Computer simulations of TFT 100 indicate that both the electron barrier and the hole barrier at junction 131 should be equal to or greater than about 0.4 eV in order to obtain transistor action. Larger hole and electron barriers at junction 131 facilitate more accumulated charge density in channel 145 and therefore lower operating voltage of TFT 100. In some embodiments, the electron barrier at junction 131 may be selected to be smaller than the hole barrier at junction 131.

Figure 2:
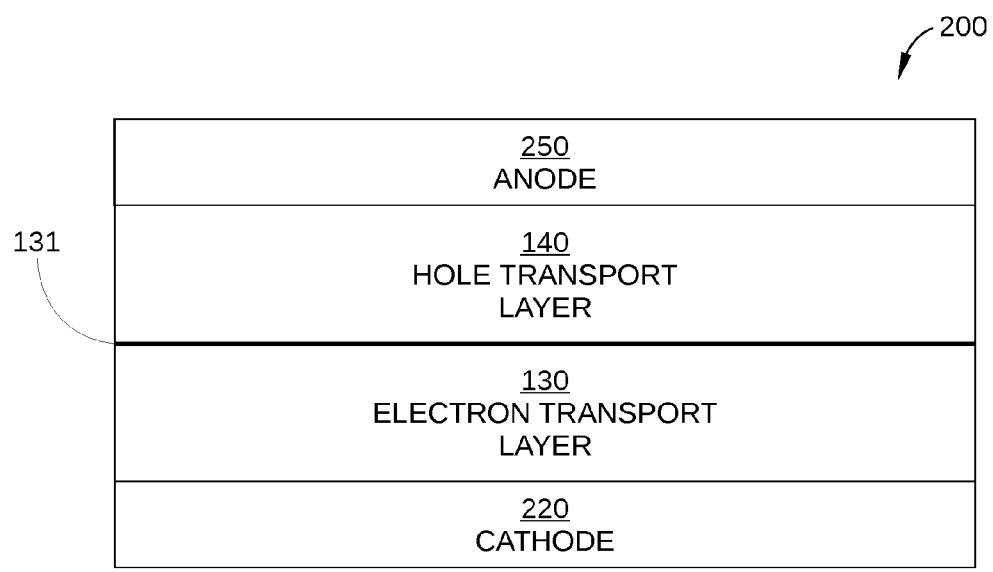
FIG. 2 illustrates a simplified schematic cross-sectional view of a capacitor arranged in accordance with at least some embodiments of the present disclosure.

In order to verify the operation and quantify the advantages of TFT 100, simulations were carried out using ATLAS, a two-dimensional device simulator used widely by both industry and academic institutions to investigate feasibility of new designs and evaluate performance. The metal insulator semiconductor (MIS) capacitor forms the core of a field effect transistor, and therefore is good test structure for quantifying behavior of TFT 100, particularly the relationship between accumulated charge density and voltage applied to gate electrode 120. The two-terminal capacitive structure that was studied is shown in FIG. 2. With an insulating layer, the capacitive structure is a conventional MIS capacitor, while with an electron transport layer, such as electron transport layer 130, the capacitive structure forms the core of the proposed transistor, i.e., TFT 100.

FIG. 2 illustrates a simplified schematic cross-sectional view of a capacitor 200, arranged in accordance with at least some embodiments of the present disclosure. Capacitor 200 is formed from thin-films used for TFT 100, and includes electron transport layer 130 and hole transport layer 140 disposed between a cathode 220 and an anode 250 as shown. In some embodiments, cathode 220 may be formed in the same way as gate electrode 120, and anode 250 may be formed in the same way as source electrode 150 and drain electrode 160.

The values of parameters used in simulations of capacitor 200 having the same geometry as a conventional MIS capacitor are shown in Table 1. The energy level parameters are representative of a system where hole transport layer 140 is pentacene and electron transport layer 130 is α, ω-disubstituted-quaterthiophenes with perfluorohexyl chains (DFH-4T). Mobility in electron transport layer 130 varies widely with deposition condition and a wide range can be chosen. In the simulations, values were selected equal to or less than experimentally reported values.

TABLE 1

| | Hole Transport Layer | Electron Transport Layer |
|---|---|---|
| Electron Affinity (eV) | 2.7 | 3.3 |
| Ionization Potential (eV) | 4.8 | 6.2 |
| $\mu_p$ (cm$^2$V$^{-1}$s$^{-1}$) | $10^{-2}$ | $10^{-9}$ |
| $\mu_n$ (cm$^2$V$^{-1}$s$^{-1}$) | $10^{-9}$ | $10^{-4}$ |
| Thickness (nm) | 100 | 150 |
| Dielectric Constant | 3 | 3 |

Figures 3A, 3B:
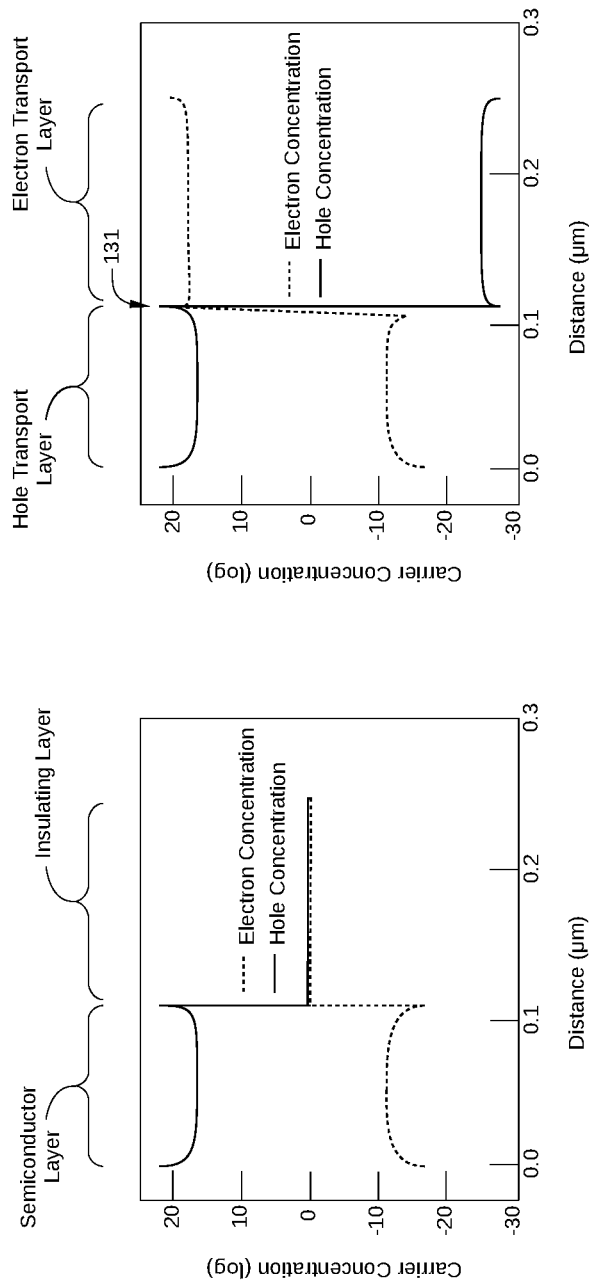
FIG. 3A is a plot showing carrier density profile for a conventional Metal-Insulator-Semiconductor (MIS) structure and FIG. 3B for the capacitor of FIG. 2.

FIG. 3A shows carrier density profile for a conventional MIS structure and FIG. 3B for capacitor 200. As expected, there are no carriers in the insulating layer and there is large hole density near the semiconductor/insulator interface. In contrast, FIG. 3B indicates that in capacitor 200, electrons are present in electron transport layer 130 and a large accumulated electron density is found proximate junction 131.

Figure 4:
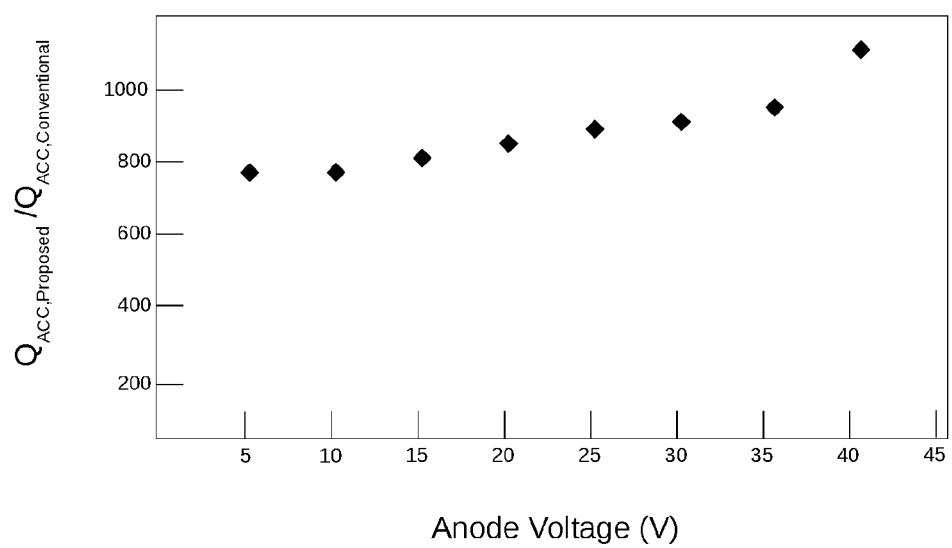
FIG. 4 is a plot of the ratio of accumulated charge density of the capacitor in FIG. 2 to accumulated charge density of a conventional MIS capacitor versus applied voltage, all arranged in accordance with at least some embodiments of the present disclosure.

FIG. 4 is a plot of the ratio of accumulated charge density of capacitor 200 to accumulated charge density of the conventional MIS capacitor versus voltage applied to anode 250. As shown, the accumulated hole density in capacitor 200 is much higher than the conventional structure at any of the applied voltages. Since the thicknesses and dielectric constants of the layers are almost the same in both the conventional MIS capacitor and capacitor 200, this improvement can be viewed as an enhancement in effective capacitance by the same factor. Thus, through a proper choice of materials for electron transport layer 130 and hole transport layer 140, the accumulated hole density in the channel of capacitor 200 can be made significantly higher than what can be achieved through field effect. Furthermore, because accumulated hole density varies linearly with applied voltage, capacitor 200 can be operated at significantly lower voltage than a conventional MIS capacitor and have the same or higher accumulated hole density as the conventional MIS capacitor.

In sum, embodiments of the disclosure set forth a TFT in which the channel in the TFT is created by current injected from the gate electrode rather than by an electrostatic field generated by voltage applied to the gate electrode. Advantageously, the accumulated charge density in the channel of the disclosed TFT can be made significantly higher than what can be generated through field effect. Consequently, to produce a desired accumulated charge density for forming a transistor channel, a much lower gate voltage is needed in a current-induced channel transistor as described herein than in a conventional TFT.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases at least one and one or more to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A semiconductor device, comprising:
   a hole transport layer having a first side and a second side, the hole transport layer comprising a material in which hole mobility is greater than electron mobility and having a first ionization potential and a first electron affinity;
   an electron transport layer having a first side and a second side, the electron transport layer comprising a material in which electron mobility is greater than hole mobility and having a second ionization potential and a second electron affinity, the second ionization potential being greater than the first ionization potential and the second electron affinity being greater than the first electron affinity, wherein the first side of the electron transport layer is directly interfaced to the second side of the hole transport layer;
   a first electrode directly interfaced to the first side of the hole transport layer;
   a second electrode directly interfaced to the first side of the hole transport layer and physically separated from the first electrode; and
   a gate electrode that is disposed between a substrate of the semiconductor device and the electron transport layer and is directly interfaced to the second side of the electron transport layer.

2. The semiconductor device of claim 1, wherein the second ionization potential is at least about 0.4 eV greater than the first ionization potential.

3. The semiconductor device of claim 1, wherein the second electron affinity is at least about 0.4 eV greater than the first electron affinity.

4. The semiconductor device of claim 1, wherein the electron transport layer comprises at least one of Buckminsterfullerene (C60), tris(8-hydroxyquinolinato) aluminum (Alq)3, α,ω-disubstituted-quaterthiophenes with perfluorohexyl chains (DFH-4T), N,N'-dioctyl-3,4,9,10-perylenedicarboximide (PTCDI-C8), and 3,4,9,10 perylenetetracarboxylic bisbenzimidazole (PTCBI), and naphthalene-tetracarboxylic-dianhydride (NTCDA).

5. The semiconductor device of claim 1, wherein the hole transport layer comprises at least one of pentacene, tetracene, ditetracene, copper phthalocyanine (CuPc), 5,5'-Bis (3-hexyl-2-thienyl)-2,2'-bithiophene, α,ω-Dihexylquaterthiophene (DH-4T), α,ω-Dihexylsexithiophene (DH-6T), and dihexyl-benzothiadiazole-quarter thiophene (DH-BTZ-4T).

6. The semiconductor device of claim 1, wherein the second ionization potential exceeds the first ionization potential by a difference in energy that is greater than a difference in energy by which the second electron affinity exceeds the first electron affinity.

7. The semiconductor device of claim 1, wherein an interface between the hole transport layer and the electron transport layer forms a barrier to electron flow from the electron transport layer to the hole transport layer and a barrier to hole flow from the hole transport layer to the electron transport layer.

8. The semiconductor device of claim 1, wherein the first electron affinity is based on a difference between the first ionization potential and an energy gap ($E_g$) of the material in which hole mobility is greater than electron mobility, and the second electron affinity is based on a difference between the second ionization potential and an energy gap ($E_g$) of the material in which electron mobility is greater than hole mobility.

9. The semiconductor device of claim 1, wherein the material in which electron mobility is greater than hole mobility has a dielectric constant of at least about 3.0.

10. The semiconductor device of claim 1, wherein the hole transport layer and the electron transport layer each comprise a thin film deposited on a substrate.

11. A thin film transistor structure, comprising:
    a hole transport layer having a first side and a second side, the hole transport layer comprising a material in which hole mobility is greater than electron mobility and having a first ionization potential and a first electron affinity;
    an electron transport layer having a first side and a second side, the electron transport layer comprising a material in which electron mobility is greater than hole mobility and having a second ionization potential and a second electron affinity, the second ionization potential being greater than the first ionization potential and the second electron affinity being greater than the first electron affinity, wherein the first side of the electron transport layer is directly interfaced to the second side of the hole transport layer;

a first electrode directly interfaced to the first side of the hole transport layer;

a second electrode directly interfaced to the first side of the hole transport layer and physically separated from the first electrode; and a third electrode that is disposed between a substrate of the semiconductor device and the electron transport layer and is directly interfaced to the second side of the electron transport layer.

12. The thin film transistor structure of claim 11, wherein an interface between the hole transport layer and the electron transport layer forms a barrier to electron flow from the electron transport layer to the hole transport layer and a barrier to hole flow from the hole transport layer to the electron transport layer.

13. The thin film transistor structure of claim 11, wherein the second ionization potential is at least about 0.4 eV greater than the first ionization potential.

14. The thin film transistor structure of claim 11, wherein the second electron affinity is at least about 0.4 eV greater than the first electron affinity.

15. The thin film transistor structure of claim 11, wherein the electron transport layer comprises at least one of Buckminsterfullerene (C60), tris(8-hydroxyquinolinato) aluminum (Alq)3, α,ω-disubstituted-quaterthiophenes with perfluorohexyl chains (DFH-4T), N,N'-dioctyl-3,4,9,10-perylenedicarboximide (PTCDI-C8), 3,4,9,10 perylenetetracarboxylic bisbenzimidazole (PTCBI) and naphthalene-tetracarboxylic-dianhydride (NTCDA).

16. The thin film transistor structure of claim 11, wherein the hole transport layer comprises at least one of pentacene, tetracene, ditetracene, copper phthalocyanine (CuPc), 5,5'-Bis(3-hexyl-2-thienyl)-2,2'-bithiophene, α,ω-Dihexylquaterthiophene (DH-4T), α,ω-Dihexylsexithiophene (DH-6T), and dihexyl-benzothiadiazole-quarter thiophene (DH-BTZ-4T).

17. The thin film transistor structure of claim 11, wherein the second ionization potential exceeds the first ionization potential by a difference in energy that is greater than a difference in energy by which the second electron affinity exceeds the first electron affinity.

18. The thin film transistor structure of claim 11, wherein the first electron affinity is based on a difference between the first ionization potential and an energy gap ($E_g$) of the material in which hole mobility is greater than electron mobility, and the second electron affinity is based on a difference between the second ionization potential and an energy gap ($E_g$) of the material in which electron mobility is greater than hole mobility.

19. The thin film transistor structure of claim 11, wherein the material in which electron mobility is greater than hole mobility has a dielectric constant of at least about 3.0.

20. The thin film transistor structure of claim 11, wherein the hole transport layer and the electron transport layer each comprises a thin film deposited on a substrate.

* * * * *

UNITED STATES PATENT AND TRADEMARK OFFICE
CERTIFICATE OF CORRECTION

PATENT NO. : 9,515,273 B2  
APPLICATION NO. : 14/380726  
DATED : December 6, 2016  
INVENTOR(S) : Mazhari et al.

Page 1 of 1

It is certified that error appears in the above-identified patent and that said Letters Patent is hereby corrected as shown below:

On the Title Page

In item (73), under "Assignee", in Column 1, Lines 1-2, delete "INDIAN INSTITUTE OF TECHNOLOGY KANPUR (IN)" and insert -- INDIAN INSTITUTE OF TECHNOLOGY KANPUR, KANPUR, UTTAR PRADESH (IN) --, therefor.

In the Specification

In Column 1, Line 8, delete "§371" and insert -- § 371 --, therefor.

In Column 1, Line 12, delete "§119 (a)" and insert -- § 119 (a) --, therefor.

In Column 4, Line 45, delete "transport" and insert -- transport layer 140 --, therefor.

In Column 9, Line 6, delete "at least one and one or more" and insert -- "at least one" and "one or more" --, therefor.

Signed and Sealed this  
Fourteenth Day of August, 2018

Andrei Iancu  
*Director of the United States Patent and Trademark Office*